United States Patent
Van Der Laan et al.

(10) Patent No.: US 11,631,534 B2
(45) Date of Patent: Apr. 18, 2023

(54) SUPERCONDUCTING WIRES FOR QUENCH DETECTION

(71) Applicant: Advanced Conductor Technologies LLC, Boulder, CO (US)

(72) Inventors: Daniël Cornelis Van Der Laan, Longmont, CO (US); Jeremy David Weiss, Boulder, CO (US)

(73) Assignee: Advanced Conductor Technologies LLC, Boulder, CO (US)

( * ) Notice: Subject to any disclaimer, the term of this patent is extended or adjusted under 35 U.S.C. 154(b) by 541 days.

(21) Appl. No.: 16/698,821

(22) Filed: Nov. 27, 2019

(65) Prior Publication Data

US 2020/0176185 A1 Jun. 4, 2020

Related U.S. Application Data

(60) Provisional application No. 62/773,815, filed on Nov. 30, 2018.

(51) Int. Cl.
*H01F 6/00* (2006.01)
*H01F 41/04* (2006.01)
*H01F 6/06* (2006.01)
*H01F 41/098* (2016.01)

(52) U.S. Cl.
CPC .......... *H01F 41/048* (2013.01); *H01F 6/06* (2013.01); *H01F 41/098* (2016.01)

(58) Field of Classification Search
CPC ..... H01L 39/16; H01F 41/048; H01F 41/098; H01F 6/02; H01F 6/06; H01B 12/02
See application file for complete search history.

(56) References Cited

U.S. PATENT DOCUMENTS

| | | | |
|---|---|---|---|
| 9,324,486 B2 | 4/2016 | Hahn et al. | |
| 10,062,485 B2 | 8/2018 | Iwasa et al. | |
| 10,079,092 B2 | 9/2018 | Iwasa et al. | |
| 10,861,626 B2 * | 12/2020 | Kim | H01F 6/06 |
| 10,897,235 B2 * | 1/2021 | Najafi | H01L 39/16 |
| 2019/0088391 A1 | 3/2019 | Hahn et al. | |
| 2020/0294698 A1 * | 9/2020 | Hayashi | H01F 6/06 |

FOREIGN PATENT DOCUMENTS

CN 107221401 A * 9/2017 ............... H01F 6/00

* cited by examiner

*Primary Examiner* — Paul D Kim
(74) *Attorney, Agent, or Firm* — Foley & Lardner LLP

(57) ABSTRACT

A superconducting device includes a first superconducting wire configured to carry a first current in a superconducting state, and to generate thermal energy upon occurrence of a hot spot during conduction. The device includes a second superconducting wire, thermally coupled to and electrically isolated from the first superconducting wire. The second superconducting wire is configured to conduct a second current in a superconducting state below, but sufficiently near its critical surface to be quenched to a non-superconducting state upon conduction of the thermal energy from the first superconducting wire.

22 Claims, 8 Drawing Sheets

SUPERCONDUCTING WIRES FOR QUENCH DETECTION

RELATED APPLICATIONS

The present application claims priority to U.S. Provisional Patent Application No. 62/773,815, filed on Nov. 30, 2018, which is incorporated by reference herein in its entirety.

GOVERNMENT LICENSE RIGHTS

This invention was made with government support under contract number DE-SC0018125 sponsored by the United States Department of Energy. The government has certain rights in the invention.

TECHNICAL FIELD

Embodiments of the present disclosure generally relate to superconducting devices and systems that employ superconducting cables or wires as described herein and, in particular embodiments, such devices and systems that have at least one second superconducting wire (or quench detection wire) that is in thermal contact with one or more of the first superconducting cable or wire, and is operated to be quenched to transition from a superconducting state to a non-superconducting state upon receiving a threshold level of heat (thermal energy) from one or more of the first superconducting cables or wires that results in a threshold level of temperature increase of the second superconducting wire. Further embodiments relate to such devices and systems, and further include electronics for detection of the quench or of the non-superconducting state of one or more of the second superconducting wires.

BACKGROUND

Significant advances have been made in the development and use of high-temperature superconducting materials over the last decade. Superconducting materials can be used in a variety of applications including, but not limited to, superconducting electrical transmission lines, superconducting electrical coils, superconducting magnets, or superconducting electronics, cables and tapes. Such superconducting tapes, wires, lines, coils, magnets or the like include superconducting materials that are capable of superconducting electrical current under suitable operation conditions (temperature, magnetic field and current density). As superconducting materials technology improves, the useful applications for such materials increases.

Various superconducting materials have been developed that are capable of conducting in a superconducting mode, when temperature, magnetic field and current density conditions are within critical parameters. For a given current density and magnetic field, different superconducting materials may have different respective critical temperatures, below which the material conducts in a superconducting mode and above which the material does not conduct in a superconducting mode (or conducts in a normal, non-superconducting mode). A typical superconducting material has a critical temperature for a given current density and ambient magnetic field, above which the material is no longer superconducting.

Some superconducting materials require operation at lower temperatures, relative to other superconducting materials. Typically, a low-temperature superconductor (LTS) requires a lower temperature (relative to a high-temperature superconductor (HTS)) to operate in a superconducting state, and will transition to a non-superconducting state at a lower temperature than HTS. High-temperature superconducting (HTS) materials can maintain superconductivity at higher temperatures than low-temperature superconducting materials. Local hot spots can develop within the superconductor while operating in its superconducting state and can cause the superconducting devise to quench (rapidly transition into its normal conducting state). Such hot spots can result in a quench, which is a rapid transition of the superconductor to its normal, dissipative state, resulting in a rapid increase of dissipation at the hot spot and potential damage to the cable or other components of the system in which the cable is employed, if not detected in time. The ability to rapidly detect the formation of a local hot spot can depend on the rate at which the hot spot propagates along the length of the superconductor (quench propagation speed). As discussed herein, the relatively high quench propagation speeds in LTS material can allow for rapid detection of the hot spot. Much lower quench propagation speeds in HTS make quench detection in HTS challenging, thereby increasing the risk of burnout of the superconductor at the local hot spot.

BRIEF SUMMARY

A superconducting device according to an example embodiment includes a first superconducting wire configured to conduct a first current in a superconducting state, and to generate thermal energy upon occurrence of a hot spot during conduction. The superconducting device includes a second superconducting wire, thermally coupled to and electrically isolated from the first superconducting wire. The second superconducting wire is configured to conduct a second current in a superconducting state below, but sufficiently near its critical surface to be quenched to a non-superconducting state upon conduction of sufficient thermal energy from the first superconducting wire.

In a superconducting device according to a further example embodiment, the quench propagation speed of the second superconducting wire is greater than the quench propagation speed of the first superconducting wire.

A superconducting device according to a further example embodiment further includes a detector coupled to the second superconducting wire, for detecting a transition of the second superconducting wire from the superconducting state to the non-superconducting state or for detecting the non-superconducting state of the second superconducting wire.

In a superconducting device according to a further example embodiment, at least a portion of the first superconducting wire is formed into a coil or a magnet coil.

In a superconducting device according to a further example embodiment, the first superconducting wire is formed of a material comprising at least one of RE-Ba$_2$Cu$_3$O$_{7-\delta}$ (REBCO), Bi$_2$Sr$_2$Ca$_2$Cu$_3$O$_x$ (Bi-2223) or Bi$_2$Sr$_2$CaCu$_2$O$_x$ (Bi-2212).

In a superconducting device according to a further example embodiment, the second superconducting wire is formed of a material comprising at least one of NbTi, Nb$_3$Sn, MgB$_2$, or an iron-based superconductor.

In a superconducting device according to a further example embodiment, the second superconducting wire is formed of a material similar to that of the first superconducting wire and is operated closer to its critical surface than the first superconducting wire.

In a superconducting device according to a further example embodiment, the second superconducting wire is configured to have a greater quench propagation speed than the quench propagation speed of the first superconducting wire by at least one of: providing a superconducting material or configuration of the second superconducting wire that provides a greater quench propagation speed than the first superconducting wire; selecting or reducing an amount of normal conducting material in the second superconducting wire; or configuring the second superconducting wire to have a selected or reduced amount of normal conducting material acting as a stabilizer or bypass current path when the second superconducting wire quenches.

In a superconducting device according to a further example embodiment, the second superconducting wire is configured to have a greater quench propagation speed than the quench propagation speed of the first superconducting wire by operating the second superconducting wire within a superconducting state, with an operating current that is adjustable to operate the second superconducting wire sufficiently near its critical surface and provide a defined level of sensitivity to quench upon the formation of a hot spot in the first superconducting wire, for a defined operating temperature and magnetic field of the superconducting device.

A superconducting device according to a further example embodiment further includes a core around which the first superconducting wire is wound. The core has at least one groove, wherein the second superconducting wire is disposed within and along the at least one groove in the core.

A superconducting device according to a further example embodiment further includes a core around which the first superconducting wire is wound, where the core has a plurality of strands of wire, and where at least one of the strands of wire of the core includes a voltage wire that provides a detectable voltage signal upon a quenching of the second superconducting wire.

A method of making a superconducting device according to an example embodiment includes providing a first superconducting wire configured to carry a first current in a superconducting state, and to generate a first thermal energy upon or prior to generation of a hot spot. The method further includes disposing a second superconducting wire in thermal communication with and electrically isolated from the first superconducting wire. The method further includes coupling the second superconducting wire to a power supply that is configured to supply a second current to the second superconducting wire; and operating the second superconducting wire in a state below but sufficiently near the critical state of the second superconducting wire, to conduct the second current in a superconducting state, and to be quenched to a non-superconducting state upon conduction of the sufficient first thermal energy from the first superconducting wire to the second superconducting wire.

In a method according to further example embodiments, the quench propagation speed of the second superconducting wire is greater than the quench propagation speed of the first superconducting wire.

The method according to further example embodiments includes coupling a detector to the second superconducting wire, for detecting a transition of the second superconducting wire from the superconducting state to the non-superconducting state or for detecting the non-superconducting state of the second superconducting wire.

The method according to further example embodiments includes forming at least a portion of the first superconducting wire into a magnet.

In the method according to further example embodiments, the first superconducting wire is formed of a material comprising at least one of REBCO, Bi-2223 or Bi-2212.

In the method according to further example embodiments, the second superconducting wire is formed of a material comprising at least one of NbTi, $Nb_3Sn$, $MgB_2$, or an iron-based superconductor.

The method according to further example embodiments includes winding the first superconducting wire around a core; and winding the second superconducting wire along a groove in the core.

In the method according to further example embodiments, the second superconducting wire is formed of a material similar to that of the first superconducting wire and the method further includes operating the second superconducting wire closer to its critical surface than the first superconducting wire.

In the method according to further example embodiments, the second superconducting wire is configured to have a greater quench propagation speed than the quench propagation speed of the first superconducting wire by at least one of: providing a superconducting material or configuration of the second superconducting wire that provides a greater quench propagation speed than the first superconducting wire; selecting or reducing an amount of normal conducting material in the second superconducting wire; or configuring the second superconducting wire to have a selected or reduced amount of normal conducting material acting as a stabilizer or bypass current path when the second superconducting wire quenches.

BRIEF DESCRIPTION OF THE DRAWINGS

The above and other features and other advantages of the present invention will be more clearly understood from the following detailed description taken in conjunction with the accompanying drawings, in which.

DETAILED DESCRIPTION

Figure 1:
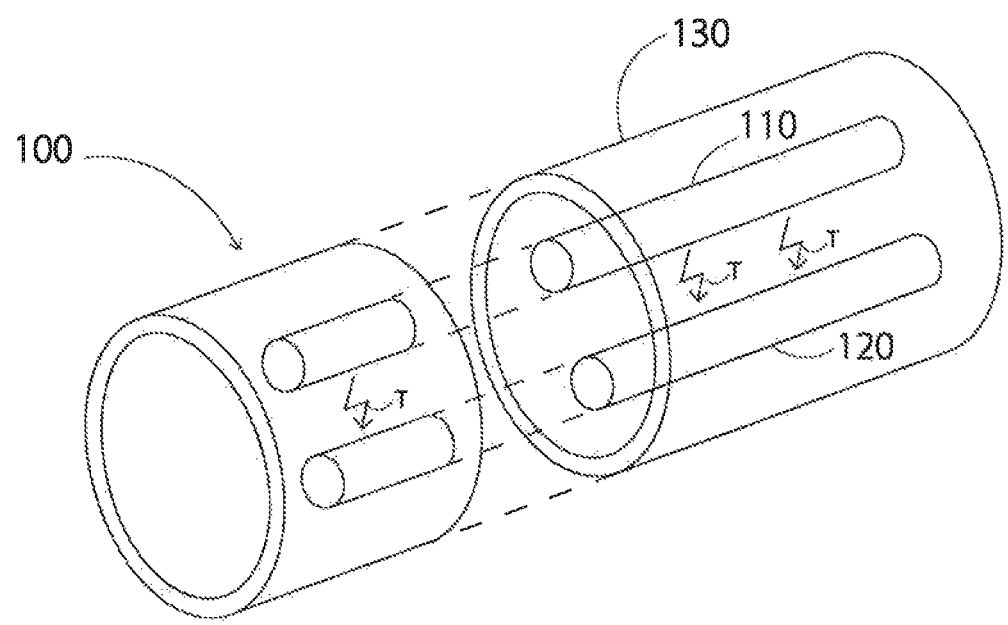
FIG. 1 is a partial, perspective view of a superconducting device and system according to some embodiments of the present disclosure.

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated. Further, features or aspects within each example embodiment should typically be considered as available for other similar features or aspects in other example embodiments.

Superconducting devices and systems according to various embodiments of the present disclosure may be configured for general or particular applications of operation and use including, but not limited to transmission lines for electrical power, electrical coils, magnets, inductors, or other devices and systems. Superconducting devices and systems that employ superconducting conductors arranged in coils can be configured for or employed in a variety of applications including, but not limited to strong superconducting electromagnets for superconducting magnetic energy storage (SMES) system, magnetic resonance imaging (MRI) or other medical devices, nuclear magnetic resonance (NMR) spectrometers, mass spectrometers or other scientific equipment, fusion reactors, particle accelerators, solenoids, magnetic levitation systems, or other devices or systems.

Embodiments of the present disclosure relate to superconducting devices and systems having multiple superconducting tapes, cables, wires, current paths or the like (hereinafter "superconducting wires") arranged in thermal communication with each other. The multiple superconducting wires include at least one first superconducting wire that is configured to conduct (in a superconducting state) a primary current, and at least one second superconducting wire that is arranged along at least a portion of (or the entire) length dimension of one or more of the first superconducting wires (such as, but not limited to, in parallel with the first superconducting wire) and in thermal contact with that length portion of the one or more first superconducting wires, but not in electrical contact with the first superconducting wire. The one or more second superconducting wire is operated to conduct a second current signal while in a superconducting state but near its critical surface (or sufficiently near its critical surface) to be quenched to transition from a superconducting state to a non-superconducting state (or normal conducting state) upon communication of a threshold level of heat (thermal energy) to one or more of the second superconducting wires from one or more of the first superconducting wires to increase the temperature of one or more of the second superconducting wires above its critical temperature at that given current density and magnetic field.

The one or more second superconducting wires may be made with superconductors having a lower critical temperature than the one or more first superconducting wires. In particular examples, the one or more second superconducting wires include LTS material, while the one or more first superconducting wires include HTS material. In other examples, both the first and second superconducting wires are made with HTS material, or are made with LTS material, but are configured or operated such that the one or more second superconducting wires quench (transition to a non-superconducting state) at a lower temperature than the one or more first superconducting wires.

In certain examples, each of the one or more first superconducting wires or the one or more second superconducting wires (or both first and second superconducting wires) may include or be wound on or within one or more Conductor on Round Core (CORC®) superconducting cables. Examples of CORC® cables are described in U.S. Pat. No. 8,938,278 (incorporated herein by reference, in its entirety). In other examples, one or more (or each) of the plurality of superconducting wires includes or is formed in another suitable superconducting cable, tape, wire or other configuration.

In certain devices and systems according to example embodiments described herein, the first and second superconducting wires are wound in one or more coils of a magnet, an inductor device, a solenoid, or another electronic coil device. Superconducting magnets or coils wound from LTS or from HTS wires may develop a local hot spot during magnetic field ramping or steady state operation. Such local hot spots can develop in other superconducting devices and systems, such as, but not limited to superconducting power, or other superconducting devices.

The hot spot may develop and propagate along the wire or may reside within a winding of the magnet or other coil, which can cause the magnet (or other coil) to quench (rapidly transition from a superconducting state into a non-superconducting state, such as a normal conducting, resistive state). In an example where a superconducting wire is quenched, the energy stored in the corresponding magnet will be dissipated at the hot spot. If the quench is not detected in time and a quench protection procedure is not timely engaged, the magnet (or other coil device) may burn out or become damaged at the hot spot.

The speed at which a hot spot propagates within the magnet (or other coil) winding (the quench propagation speed) is relatively high in LTS, allowing for relatively fast detection of the hot spot. High quench propagation speeds allow dissipation (and transition to non-superconducting state) to be spread out over a larger fraction of the magnet (or other coil) winding or wire length, at (or soon after) the onset of the quench. The quench propagation speed in HTS materials is much lower than in LTS, making it difficult to detect the onset of a quench in an HTS magnet or other device. In a magnet or other coil configuration having HTS wires, a quench of an HTS cable can result in the magnetic energy in the coil being dissipated in a relatively small fraction of the magnet winding along which the hot spot has propagated. Accordingly, certain embodiments described herein may be configured to allow for quick detection (or to quickly detect) the onset of a quench in an HTS magnet, coil or other superconducting device, regardless of the location and size of the hot spot. According to further embodiments, upon detection of a hot spot, one or more quench protection or avoidance procedures may be engaged.

A device, system or method according to particular examples described herein includes one or more first superconducting wires that is operated to conduct a first current in a superconducting state, and one or more second superconducting wires that is operated in a superconducting state but closer to its critical surface than the first superconducting wire(s). The second superconducting wire(s) may have a quench propagation speed that is higher (or sufficiently higher) than the quench propagation speed of the first superconducting wire(s), to quench along its length (upon reaching or exceeding its critical surface) in a detectable manner before the first superconducting wire(s) quench (reaching or exceeding its critical surface), or before a quench of the first superconducting wire(s) propagates along a particular or defined length of the first superconducting wire(s), or before the temperature at the hot spot of the first superconducting wire(s) increases to a level at which damage could occur.

The quench propagation speed of the first and second superconducting wires can depend, at least in part, on the type and configuration of superconducting material employed in the superconducting wires, including, but not limited to the amount of stabilizer or normal metal (e.g., acting as a shunt or current bypass, to bypass a hot spot), the oxygen content, the flux pinning strength, or other components or processing of the superconducting wires. Alternatively, or in addition, the quench propagation speed of the first and second superconducting wires can depend, in part, on the operating parameters or conditions in which the superconducting wires are operated, including, but not limited to current density, magnetic field, local cooling and other factors. In particular examples, these and/or other factors are selected or configured such that, in typical operation, the first and second superconducting wires are operated in superconducting states, but with the second superconducting wire(s) operated closer to its critical surface than the first superconducting wire(s). For example, the quench propagation speed of the second superconducting wire(s) may be increased or made higher than that of the first superconducting wire(s), through the selection of materials, wire configurations or a combination thereof, for the first and second superconducting wire(s). In one non-limiting example, the quench propagation speed of the second superconducting wire(s) may be increased by reducing the amount of normal conducting stabilizer or bypass material that is present in the second superconducting wire(s) relative to the first superconducting wire(s). In other examples, the quench propagation speed of the second superconducting wire(s) may be made faster than that of the first superconducting wire(s) by other suitable selection of materials and configurations for those wires.

In some examples, the one or more second superconducting wire(s) may be operated closer to its critical surface by employing an LTS or other superconducting material, such that the second superconducting wire has a lower critical temperature than the one or more first superconducting wire(s) that employ HTS or other superconducting material having a higher critical temperature. In such examples, the first and second superconducting wires may be operated at a temperature that allows the second superconducting wire(s) to be in a superconducting state during typical operation, but sufficiently close to its critical temperature to cause the second superconducting wire(s) to rise in temperature and quench, when sufficient heat (corresponding to a hot spot or formation of a hot spot condition) is received from the first superconducting wire(s). In other examples, the one or more second superconducting wires may be operated closer to its critical surface (compared to the one or more first superconducting wires), by selecting or adjusting the current density and/or the magnetic field in the second superconducting wire(s) to be near the critical surface values for those parameters. In certain examples, any suitable combination of temperature, current density and magnetic field may be adjusted or selected (by selecting materials or configurations of the superconducting wires and/or aspects of the operating environment), such that the second superconducting wire(s) is operated sufficiently close to its critical surface to quench as described herein, in response to a hot spot or formation of a hot spot condition in the first superconducting wire(s).

A device, system or method according to particular examples described herein includes one or more second superconducting wire(s) operated closer to its critical surface than the one or more first superconducting wire(s), where the first and second superconducting wire(s) are wound as a magnet or coil, and where the second superconducting wire(s) act as one or more quench detection wire(s). In other examples, the first and second superconducting wires need not be wound in a coil but may extend in a length dimension to provide a conduction path for transmission of power over distance defined by the length dimension.

The superconducting wire with lower critical temperature (such as LTS wire) is electrically insulated from (or is resistively separated from) the superconducting wire with higher critical temperature (such as HTS wire) and carries a small current that is a predetermined fraction of its critical current, where the critical current is the maximum current the superconducting wire can carry before it transitions to its normal conducting state, at the operating temperature and magnetic field of the magnet, coil or transmission line. In particular examples, the material of the superconducting wire with lower critical temperature (such as LTS wire) is chosen such that its critical surface, determined by the temperature, magnetic field, and current density, is such that the superconducting wire with lower critical temperature (such as LTS wire) would return to its normal conducting state as soon as the local temperature of the superconducting wire with lower critical temperature (such as LTS wire) is increased by a relatively small value. The wires are arranged in sufficient thermal communication with each other, such that a potential hot spot that may occur within the superconducting wire with higher critical temperature (such as HTS wire) just before or at the onset of a quench would cause local heating of the superconducting quench wire with lower critical temperature (such as LTS wire), sufficient to drive a length (or zone) of the superconducting quench wire with lower critical temperature (such as LTS wire) into its normal state much more quickly than the superconducting wire with higher critical temperature (such as HTS wire).

While certain examples described herein include HTS and LTS wires for the first and second superconducting wires, respectively, other examples may include first and second superconducting wires that are both HTS or that are both LTS, or that have other suitable materials or configurations. In some examples, the first and second superconducting wires may have superconducting materials or configurations that are the same, similar or different from each other, but where the second superconducting wire(s) is operated closer to its critical surface (or to have a faster quench propagation speed) than the first superconducting wire(s). For example, the second superconducting wire(s) may be operated closer to their critical surface than the first superconducting wire(s) by operating the second superconducting wire(s) closer to its critical current density than the first superconducting wire(s), or by adjusting or selecting other operating parameters that affect operation relative to the critical surface of the wire(s), as described herein.

In particular, the normal zone in the low-temperature superconducting (or LTS) wire would grow much more quickly along its length than in the high-temperature superconducting (or HTS) wire, because of the much higher quench propagation speed of low-temperature superconducting (or LTS) wires relative to the high-temperature superconducting (or HTS) wires. In particular examples, as the normal zone of the low-temperature superconducting (or LTS) wire quickly propagates, the operating current of the low-temperature superconducting (or LTS) quench wire would cause a quickly growing voltage over its length during the quench. In such examples, the voltage across a portion of (or the entire) length of the low-temperature superconducting (or LTS) wire, is measured, detected or monitored. The much higher quench propagation speed of the low-temperature superconducting (or LTS) quench wire, compared to that of the high-temperature superconducting (or HTS) magnet or transmission wire, would result in a much higher voltage, developing during a much shorter time, over the low-temperature superconducting (or LTS) wire compared to the voltage over the high-temperature superconducting (or HTS) wire. Accordingly, in certain examples, the low-temperature superconducting (or LTS) quench wire would allow for much quicker and more accurate quench detection of the high-temperature superconducting (or HTS) magnet or transmission wire, allowing for the quench protection procedure to be initiated, for example, but not limited to before the quench of the high-temperature superconducting (or HTS) wire occurs, or before the temperature of the hot spot in the high-temperature superconducting (or HTS) wire exceeds a value at which damage occurs.

A simplified diagram in FIG. 1 shows a device or system 100 (or a portion of a device or system 100) that includes one or more first superconducting wires and one or more second superconducting wires. In the drawing in FIG. 1, a single first superconducting wire 110 and a single second superconducting wire 120 are shown, for simplifying the description. However, it will be understood that each wire 110 and 120 may represent one or more (or multiple) first or second superconducting wires, according to example embodiments described herein. The first and second superconducting wires 110 and 120 are electrically insulated from each other (or sufficiently separated by a resistive barrier), so that each first and second superconducting wire 110 and 120 (or each of the plurality of first superconducting wires and second superconducting wires) may conduct current in a superconducting state, independent of the other of the first and second superconducting wire 110 and 120 (or of the other of the plurality of first superconducting wires and second superconducting wires).

The first and second superconducting wires 110 and 120 may be arranged within a low temperature environment housing such as, but not limited to, a cryostat housing 130, when operating in a superconducting state. In particular examples and applications of use, one or more electrical conductors and electronics (not shown) located outside of the cryostat housing 130 may be electrically coupled to the first and second superconducting wires 110 and 120, through any suitable connection interface (not shown), such as, but not limited to those described in U.S. patent application Ser. No. 16/439,200 (which is incorporated herein by reference, in its entirety).

Each of the first and second superconducting wires 110 and 120 has a longitudinal dimension of any suitable length, which may be selected to accommodate the application of use, and may be a small length of one or more millimeters (or less) in certain devices or systems, up to a larger length of one or more kilometers (or greater), for example, to provide part of an electrical transmission line for communicating electrical power over the length distance. The first and second superconducting wires 110 and 120, and the cryostat housing 130 are each shown in FIG. 1, with a slice section and broken lines to indicate that the length along a longitudinal axis may be of any suitable length, depending upon the application of use.

Figure 2:
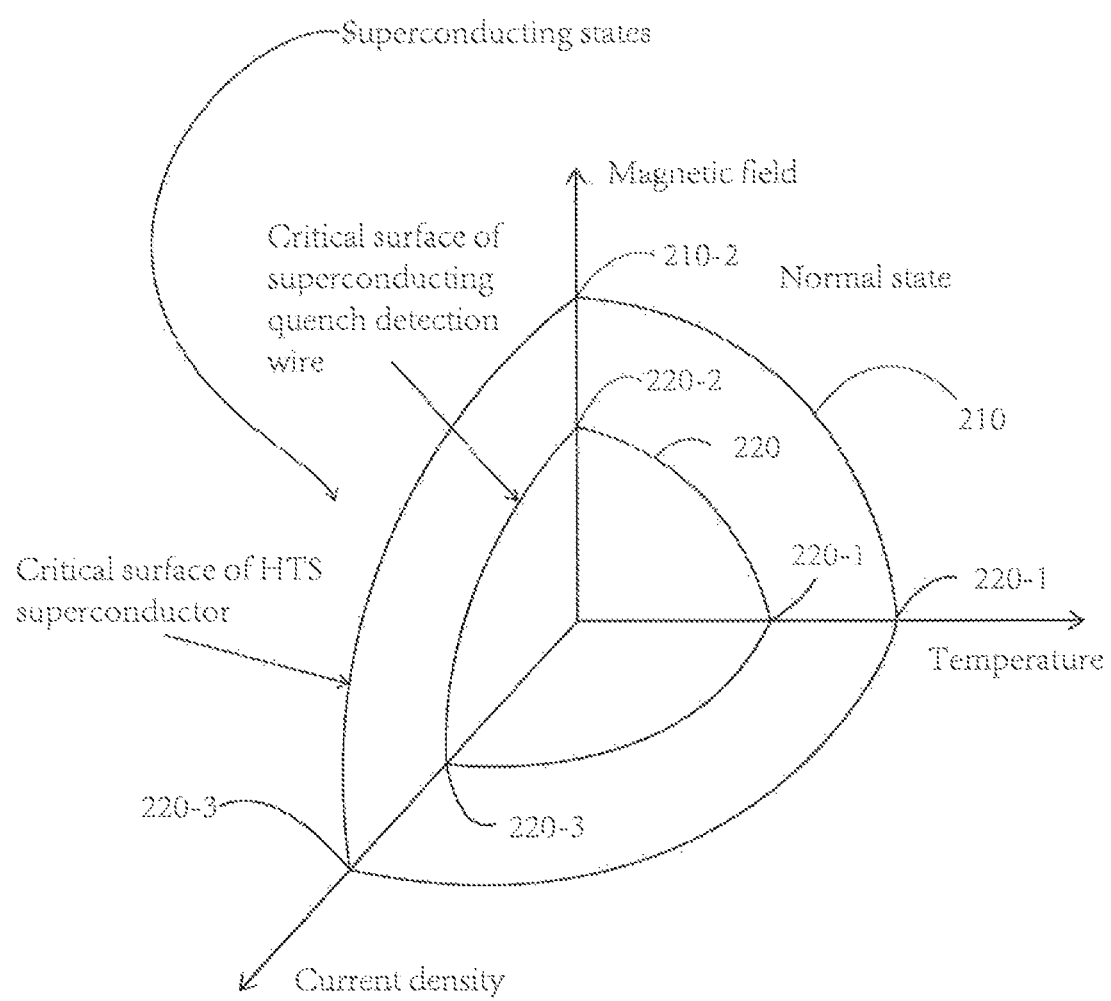
FIG. 2 is a diagram showing critical surfaces of superconducting materials in devices and systems, according to some embodiments of the present disclosure.

Referring to FIG. 2, the critical surface 210 of a material for the first superconducting wire 110 and the critical surface 220 of a material for the second superconducting wire 120 are respectively shown, in accordance with some embodiments. Each of the critical surfaces 210 and 220 are located in a coordinate extending along three axes: a temperature axis, a magnetic field axis, and a current density axis. The critical surface 210 intersecting the temperature axis, magnetic field axis, and the current density axis with respective values: 210-1, 210-2, and 210-3; and the critical surface 220 intersecting the temperature axis, magnetic field axis, and the current density axis with respective values: 220-1, 220-2, and 220-3. The value (e.g., 210-1, 220-1) with which the critical surface intersects the temperature axis may be referred to as a critical temperature of the corresponding superconducting wire (or the superconducting material) without the presence of magnetic field or current density; the value (e.g., 210-2, 220-2) by which the critical surface intersects the magnetic field axis may be referred to as a critical magnetic field of the corresponding superconducting wire (or the superconducting material) at zero temperature and with no current density; and value (e.g., 210-3, 220-3) by which the critical surface intersects the current density axis may be referred to as a critical current density of the corresponding superconducting wire (or the superconducting material) at zero temperature and zero magnetic field. An increase in magnetic field or current density will reduce the critical temperature of the corresponding superconducting wire (or the superconducting material). An increase in temperature or current density will reduce the critical magnetic field of the superconducting wire (or superconducting material). An increase in temperature or magnetic field will reduce the critical current density of the superconducting wire (or superconducting material).

When a superconducting wire is operated beneath the corresponding critical surface (e.g., defined by the respective critical temperature, critical magnetic field, and critical current density), the superconducting wire can carry a current in a superconducting state. On the other hand, when the superconducting wire is operated above the critical surface, the superconducting wire can only carry a current in a non-superconducting state. In some embodiments, the first and second superconducting wires 110 and 120 may be selected or configured, such that, when operating in a superconducting state in the device 100, the first superconducting wire 110 has a critical surface 210 that is higher (or substantially higher) than the critical surface 220 of the second superconducting wire 120, as shown in FIG. 2. The material and configuration of the second superconducting wire 120 should be selected such that the operating temperature and magnetic field of the superconducting device 100 allows the second superconducting wire 120 to operate below its critical surface 220. Further, the second superconducting wire 120 may be configured to carry a current in a superconducting state below, that makes it operate sufficiently near the critical surface 220.

The combination of magnetic field and temperature, together with the current density in the second superconducting wire 120 (or quench detection wire) determines the proximity of the second superconducting wire 120 to its critical surface, during operation of the device 100. In particular examples, the material and composition of the second superconducting wire 120 (or quench detection wire) is selected such that its critical surface is lower than that of the first superconducting wire 110, and that its quench propagation speed is higher than that of the first superconducting wire 110, during typical operation of the device 100.

The material selection for the second superconducting wire 120 (or quench detection wire) may depend on the typical operation conditions of the device 100, including, but not limited to the operating temperature and maximum magnetic field experienced by the magnet windings or transmission line during typical operation.

Figure 3:
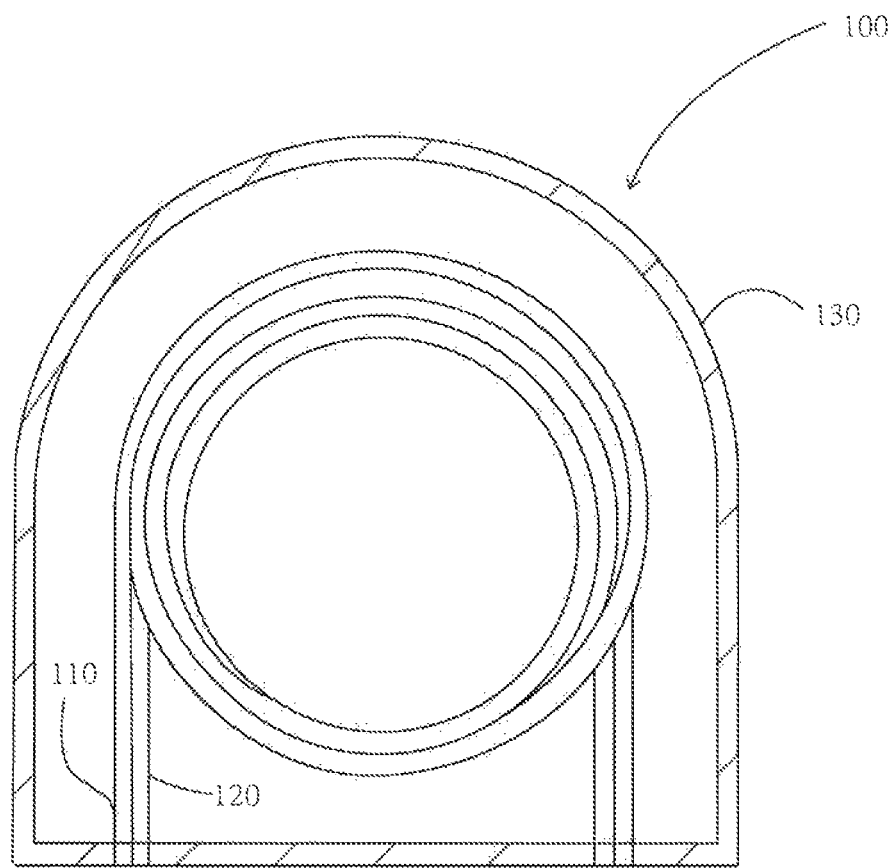
FIG. 3 is a partial, perspective view of another superconducting device and system according to some embodiments of the present disclosure.

In certain examples, the first and second superconducting wires 110 and 120 may be wound in a coil (or multiple coils), for example, of a magnet or other electrical coil device. FIG. 3 represents an example of the first and second superconducting wires 110 wound in a coil and located within a low temperature environment housing, or cryostat housing 130. Such coils may include small coils having any suitable number of winds and any suitable diameter including diameters of one or more millimeters (or less), to larger coils having diameters of one or more centimeter, meters, kilometers (or greater), depending upon the application of use.

The first superconducting wire 110 and the second superconducting wire 120 may have respective different critical surfaces or operate at different margins from their critical surface. In particular examples, the superconducting material and/or the wire design and operation of the first and second superconducting wires 110 and 120 may be selected or configured for providing different respective critical surfaces or different operating margins from their critical surfaces in a defined operating environment. For example, the first superconducting wire 110 can have a first critical temperature, and the second superconducting wire 120 can have a second critical temperature, wherein the first critical temperature is higher than the second critical temperature. Accordingly, the first superconducting wire 110 may be a, but not limited to an HTS wire relative to the second superconducting wire 120 which may be, but not limited to a low-temperature superconducting wire.

In some embodiments, the first superconducting wire 110 can carry or conduct a first current in a superconducting state, where the first current may be a primary current for powering a magnet coil or other electrical coil or may be a primary current for communicating electrical power, along the length of the wire 110. The second superconducting wire 120 can carry or conduct a second current in a superconducting state below, but sufficiently near its critical surface to be quenched to a non-superconducting state upon receiving sufficient thermal energy (heat) to increase its temperature enough such that the superconducting wire crosses its critical surface.

In some embodiments, the second superconducting wire 120 (or quench wire) is connected to and powered by a first (or dedicated) power source, while the first superconducting wire 110 (or primary magnet or transmission wire) is connected to and powered by a second, separate power source capable of delivering much higher current signals than the first power source. Alternatively, the first and second superconducting wires 110 and 120 may be connected to and powered by the same power source, with desired source currents provided to each of the wires 110 and 120, through appropriate circuitry, for instance by including one or more suitable resisters or resistive circuit elements or other current limiting circuitry between the power source and the second superconducting wire 120.

At least a portion of the length of the second superconducting wire 120 is thermally coupled to at least a portion of the length of the first superconducting wire 110, as represented by the arrows labeled T in FIG. 1. In certain examples, the first and second superconducting wires are in contact or sufficiently close proximity with each other (e.g., electrically insulated, but in good thermal contact with each other), such that thermal energy T may be transferred from the first superconducting wire 110 to the second superconducting wire 120. In the drawing of FIG. 1, the first and second superconducting wires 110 and 120 are shown in proximity to each other, but separated by a gap. In the drawing of FIG. 3, the first and second superconducting wires 110 and 120 are shown in close proximity, such as in contact with each other or slightly spaced from each other. In other examples, the first and second superconducting wires 110 and 120 may be arranged further apart, closer together or in physical contact, or may be separated by one or more other wires, electrical insulation, barriers or other structures that allow for communication of thermal energy (heat) from the wire 110 to the wire 120. In certain examples, the wires 110 and 120 may be twisted together or wrapped helically around each other, along their length dimensions.

In examples in which the first and second wires 110 and 120 are wound in one or more coils, the first and second wires 110 and 120 may be brought into contact or other thermal communication with each other, before or after one or both of the wires are wound into one or more coils. Alternatively, the first and second wires 110 and 120 may be wound in thermal communication, together, in the same one or more coils.

By arranging the first and second superconducting wires 110 and 120 in sufficiently good thermal communication with each other and operating the second superconducting wire 120 sufficiently near its critical surface, when a hot spot is developed in the first superconducting wire 110, thermal energy of the hot spot can be conducted in the second superconducting wire 120 and cause the second superconducting wire 120 to swiftly transition from the superconducting state to the non-superconducting state (quench). In particular examples, the second superconducting wire 120 can be configured (by selection of materials or other design features of the wire) to have a substantially greater quench propagation speed than the first superconducting wire 110. Thus, upon sufficient thermal energy being conducted in the second superconducting wire 120, a normal region (the region along the wire 120 that has transitioned to a non-superconducting state) would grow and spread more quickly along a length of the second superconducting wire 120 than along a length of the first superconducting wire 110. As such, resistance of the second superconducting wire 120 can be increased, which can induce an increase of voltage along the second superconducting wire 120. This can advantageously allow a quick detection on the second superconducting wire 120, of a quench occurring or the onset of a quench that may occur along the first superconducting wire 110. In certain examples, a system or method may include mechanisms or procedures to reduce or avoid a risk of damage to the superconducting magnet or other device containing the first and second superconducting wires 110 and 120.

In certain non-limiting examples, the first superconducting wire 110 may be formed of a material selected from at least one of: REBCO, Bi-2223 or Bi-2212; and the second superconducting wire 120 may be formed of a material selected from at least one of: NbTi, $Nb_3Sn$, $MgB_2$, or an iron-based superconductor, while taking into account the operating parameters (e.g., the operating temperature, the operating magnetic field, the operating current density). In certain non-limiting examples, the second superconducting wire 120 may be a relatively thin superconducting wire, including a single, or multifilamentary NbTi, $Nb_3Sn$ or $MgB_2$ wire, and may include a copper, copper alloy or other matrix material wound or arranged in close contact (or thermal communication) with one or more first superconducting (or HTS) wires. In other examples, one or both of the first and second superconducting wires 110 and 120 may be made with other suitable superconducting materials.

For example, for applications or operations of use of the superconducting device 100 below a temperature of 10 kelvin (K) and/or under a magnetic field equal to or less than 10-13 tesla (T), NbTi may be selected as a material for the second superconducting wire 120. The second superconducting wire 120, when made of NbTi, can be configured (e.g., a combination of the magnetic field, the temperature, and the current density in the second superconducting wire 120) to operate below the critical surface of NbTi. In another example, for applications or operations of use of the superconducting device 100 above a temperature of 10 K, and/or under a magnetic field greater than 13 T, $Nb_3Sn$ may be selected as a material for the second superconducting wire 120. In yet another example, for applications or operations of use of the superconducting device 100 above a temperature of 18 K, $MgB_2$ may be selected as the material for the second superconducting wire 120. In other example embodiments, other suitable materials may be used for the second superconducting wire 120 including but not limited to iron-based superconductors. In certain examples, the second superconducting wire 120 has a suitable material (which may an LTS, or an HTS or other suitable superconducting material) and is configured for increasing (or providing a higher) quench propagation speed than the first superconducting wire 110. In some examples, the quench propagation speed of the second superconducting wire 120 may be increased by limiting the electrical stability or thermal stability (or both) of the wire, by reducing the normal conducting material that acts as a shunt or current bypass at quenched locations in the wire, by reducing the electrical conductivity of the normal conducting material in the quench wire, or by other suitable means or combinations.

During typical operation of the device 100 (including the operating temperature and magnetic field in which the device 100 ordinarily operates), the second superconducting wire 120 (or quench detection wire) is operated at a current density below its critical current density. In certain examples, the operating current density of the second superconducting wire 120 (or quench detection wire) as a percentage of its critical current density may be a design parameter which, in-part, determines the sensitivity of the second superconducting wire 120 (or quench detection wire) to a local increase in temperature that may be caused by the first superconducting wire 110 developing a hot spot. Operating the second superconducting wire 120 (or quench detection wire) close to its critical current density, and thus critical surface, will make it more sensitive to an increase in temperature, but also to other factors that may cause it to quench, such as heating induced by a changing magnetic field, movement of the conductor, or local flux jumps, or other changes in magnetic field. Operating too far below its critical current density, and thus critical surface, may reduce the sensitivity of the second superconducting wire 120 (or quench detection wire), which may result in a delayed detection of a hot spot or quench in the first superconducting wire 110. Accordingly, one or more (or any combination of) the configuration (material and design) of the second superconducting wire 120, the operating current density of the second superconducting wire 120, the magnetic field influence on the second superconducting wire 120, or the temperature of the second superconducting wire, may be selected to provide a suitable sensitivity to hot spots or quenching of the first superconducting wire 110, based on the operating parameters of the device 100. In certain examples, based on the material of a superconducting wire, a set of corresponding critical operating parameters (the critical magnetic field, the critical temperature, and the critical current density) may be defined.

In certain examples, the operating current density of the second superconducting wire 120 can be varied or adjusted over a period of operation (or at different stages of operation) of the device 100. In certain examples in which the device 100 is a superconducting magnet, the second superconducting wire 120 can be operated at a lower current density when the superconducting magnet is energized (or de-energized) and the magnetic field is changing. The second superconducting wire 120 may be relatively sensitive in a changing magnetic field, as compared to the first superconducting wire 110. As such, the second superconducting wire 120 can be driven into a non-superconducting state (quenched) due to heating in the second superconducting wire 120, caused by the changing magnetic field. Accordingly, by operating the second superconducting wire 120 at a lower current density during an energizing or de-energizing stage of operation of the superconducting magnet, the second superconducting wire 120 can be less susceptible to be driven into a non-superconducting state (quenched) by the varying magnetic field. In such examples, the operating current density of the second superconducting wire 120 can be increased at a further stage of operation of the device 100, for example, after the superconducting magnet device has reached a steady state and the magnetic field is no longer changing.

As mentioned above, the first superconducting wire 110 and second superconducting wire 120 are thermally coupled to each other. In this regard, the first superconducting wire 110 and second superconducting wire 120 may be disposed substantially close to each other, in contact with each other, twisted together, wound together or in other suitable arrangements in which a length (or substantial length) of the first superconducting wire 110 is in thermal communication with a length (or substantial length) of the second superconducting wire 120. While they are arranged in thermal communication with each other, in particular examples, the first superconducting wire 110 and second superconducting wire 120 are electrically isolated from each other. As such, one or more electrically insulating layers or materials may be disposed on or between the first superconducting wire 110 and second superconducting wire 120. Although not shown, it is understood that one or both of the superconducting wires 110 and 120 can include one or more electrically insulating layers or materials on its outer surface.

In certain non-limiting examples, one or both of the first and second superconducting wires 110 and 120 may have a CORC® configuration, such as, but not limited to those described in U.S. Pat. No. 8,938,278. In certain CORC® configuration examples, one or each of the first and second superconducting wires 110 and 120 may have a generally flat tape configuration or a round-diameter wire configuration (or other suitable configuration), and may be helically wound around a core (or former), along the length of the core (or former). Thus, in certain examples, the first and second superconducting wires 110 and 120 may be wound around the core (or former) in one or more layers, in a manner similar to the tape conductors and layers described in U.S. Pat. No. 8,938,278. For example, the first and second superconducting wires 110 and 120 may be wound around the core (or former), side-by-side, in the same layer (at the same radial distance from the axis of the core). Alternatively, or in addition, the first and second superconducting wires 110 and 120 may be wound around the core (or former) in different respective layers relative to each other (where each layer is at a different radial distance from the axis of the core relative to each other layers). In certain examples, the first and second superconducting wires 110 and 120 may be wound around the core (or former), in both a side-by-side in the same layer, and in multiple layers.

Figure 4:
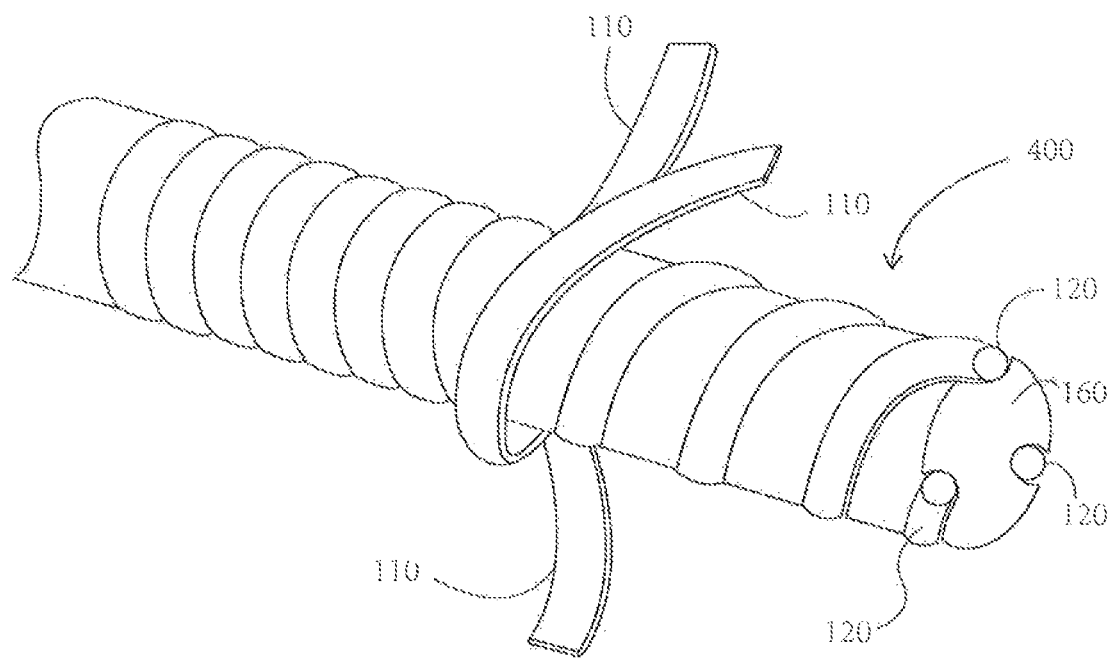
FIG. 4 is a partial, exploded, perspective, cross-section view of a superconducting cable, according to some embodiments of the present disclosure.

In certain examples, one or more second superconducting wires 120 (or quench detection wires) is integrated within a core (or former) of a cable, such as but not limited to a CORC® cable. For example, as shown in FIG. 4, one or more second superconducting wires 120 (or quench detection wires) may be integrated within the core (or former) 160, by placing them in grooves or channels located along the length of the core (or former) 160. Alternatively, or in addition, one or more second superconducting wires 120 may form some or all of the core (or former), for example, as one or more strands of a multi-strand core (or former). Alternatively, or in addition, one or more second superconducting wires 120 may be wound between winds or between layers of first superconducting wires or tapes 110 in one or more tape layers, or at the outer layer or surface of the CORC® cable.

In FIG. 4, an example of a cable 400 is shown in a partially exploded, cross-sectional, perspective view, where the core (or former) 160 includes a plurality of spiral or helical grooves (or channels) along the length of its outer surface. In the example in FIG. 4, the core (or former) 160 has three grooves 160a, 160b and 160c. In other examples, the core (or former) 160 may include a single groove, two grooves, or more than three grooves. In other examples, one or more of the grooves may extend along the lengthwise (or axial) dimension of the core (or former) 160 in a non-spiral manner, such as, but not limited to parallel to the axis of the core (or former) 160. In the example in FIG. 4, a respective second superconducting wire 120 is provided in each respective groove 160a, 160b and 160c. In other examples, a first superconducting wire 110 may be arranged in one or more of the grooves 160a, 160b and 160c, in place of or adjacent to a second superconducting wire 120.

In some examples, the second superconducting wire(s) 120 may include one or more layers or coatings of electrically insulating or resistive material to electrically insulate or isolate the second superconducting wire(s) 120 from the core (or former) 160 and the first superconducting wire(s) 110 in the cable 400. Alternatively, or in addition, the core (or former) 160 may be made of an electrically insulating material or have one or more electrically insulating layers or coatings. In certain examples, the second superconducting wire(s) 120 are located within one or more of the grooves 160a, 160b and 160c, and may maintain their position and be inhibited from sliding within the cable 400, for example, during bending of the cable 400. In some examples, one or more (or each) of the grooves 160a, 160b and 160c have a width that is wider (or slightly wider) than the width of the second superconducting wire(s) 120, to allow some movement of the second superconducting wire(s) 120 during bending of the cable 400, while the second superconducting wire(s) 120 are retained within the grooves. In further examples, additional materials having high thermal conductivity, such as, but not limited to an oil, grease, adhesive, or the like, may be included in the groove, to help retain the second superconducting wire(s) 120 in place, while allowing good thermal communication between the core (or former) 160 and the second superconducting wire(s) 120.

As shown in FIG. 4, one or more (or a plurality of) first superconducting wires 110 (shown as having a tape configuration in FIG. 4) may be wound around the core (or former) 160 in a helical manner. In certain examples, the one or more first superconducting wires 110 are wound around the core (or former 160), between winds of the one or more second superconducting wires 120, or in one or more layers over the winds of the one or more second superconducting wires 120, or both between and over the winds of the one or more second superconducting wires 120. In particular examples, the one or more first superconducting wires 110 are arranged in thermal communication with the one or more second superconducting wires 120, for example, by being in contact or sufficiently close proximity to the one or more second superconducting wires 120 in the cable 400. In certain examples, the core (or former) 160 may be made of a material that helps to transfer thermal energy within the cable 400 to the second superconducting wire(s) 120.

In the example shown in FIG. 4, the one or more first superconducting wires 110 are shown as being helically wound around the core (or former 160) in parallel to the helical configuration of the grooves 160a, 160b and 160c and the helical wind of the second superconducting wire(s) 120. In other examples, one or more (or each) of the first superconducting wires 110 may be helically wound around the core (or former 160) in a non-parallel manner, or in an opposite direction relative to the helical configuration of the grooves 160a, 160b and 160c and the helical wind of the second superconducting wire(s) 120. In particular examples, the one or more (or each) of the first superconducting wires 110 may be helically wound around the core (or former 160) in any suitable manner that provides sufficient thermal communication between the first superconducting wire(s) 110 and the second superconducting wire(s) 120, to quench the second superconducting wire(s) 120 upon or sufficiently before the development of a quench of the first superconducting wire(s) 110.

The core (or former) 160 may be composed of any suitable material and, in particular examples, is composed of a flexible material that allows the cable 400 to be flexible. For example, the core (or former) 160 may be made of one or more of copper or other metals, polymers, rubbers, ceramics or the like. In particular examples, the core (or former 160) is sufficiently flexible to allow the cable 400 to be wound in a coil structure of a superconducting magnet or other superconducting device or system. In other examples, the core (or former) 160 and the superconducting cable 400 may be formed to be rigid or relatively rigid, for certain applications of use. In certain examples, the core (or former) 160 may have a hollow form (such as a hollow, tube shape). In other examples, the core (or former) 160 has a solid form (such as a solid, shaft configuration). In other embodiments, the core (or former) 160 has a solid, stranded form (such as multiple strands of wire or cable that are adhered, held or twisted together to form a multi-stand core). In further examples, the core (or former) 160 may have a combination of forms along its length. Further examples of suitable cores (or formers) are described in U.S. Pat. No. 8,938,278.

However, as shown in FIG. 4, by providing one or more grooves (or channels) 160a, 160b and 160c along the length of the core (or former) 160, one or more second superconducting wires 120 may be arranged within the one or more grooves (or channels) to extend along the outer periphery of the core (or former) 160. In examples in which the one or more grooves (or channels) 160a, 160b and 160c have a helical configuration, the one or more second superconducting wires 120 within the one or more grooves (or channels), helically wind around the outer periphery of the core (or former) 160.

In certain examples, the helical configuration of the grooves (or channels 160a, 160b, and 160c) is configured to allow or enhance bending of the core (or former) 160 without overstraining and potentially breaking the second superconducting wire(s) 120, for example, when the cable 400 is wound into a coil form.

According to particular examples, a quench detection circuit is included in the device 100, to responsively detect, monitor, or otherwise manage a hot spot or abnormal thermal activity that may occur in the first superconducting wire(s) 110. In some examples, the quench detection circuit is configured to detect or monitor a voltage over the second superconducting wire(s) 120, to detect a quench state of the second superconducting wire(s) 120. For example, upon transitioning to a non-superconducting state (quench), the resistance of the second superconducting wire(s) 120 increases and a voltage develops over the length of the second superconducting wire(s) 120. In particular examples, a quench detection circuit may include a pair of voltage leads electrically coupling the opposite ends of each second superconducting wire 120 to a voltage detector. The voltage leads and voltage detector may measure or detect a sudden increase in voltage at the time the second superconducting wire(s) quench and return to a normal conducting state, while the operating current in the second superconducting wire(s) is kept constant.

In certain examples, the device 100 and method of operating the device 100 includes one or more quench protection procedures that may be activated, upon detection of a voltage level on the voltage leads connected to the second superconducting wire(s) exceeding a predefined minimum value. In examples in which the second superconducting wire(s) 120 are integrated into a superconducting magnet cable or wire, it will also be wound into the coil and, therefore, have a non-zero inductance. The inductance of the second superconducting wire(s) 120 in combination with a changing magnetic field in the device 100, could result in a level of voltage offset or noise being measured by the voltage leads. Accordingly, in certain examples, the voltage noise and offset voltage measured with the voltage leads may be reduced, by integrating one of the voltage leads into the wound coil, cable or wire (for example, according to U.S. Pat. No. 5,999,383).

Accordingly, in certain examples, one or more voltage leads for a voltage detection circuit, or other purpose, are co-wound on a superconducting cable, with the first superconducting wire(s) 110 and the second superconducting wire(s) 120. In particular examples, the inductance of the co-wound voltage leads reduces or cancels out the inductance of the second superconducting wire(s) 120.

Figure 5:
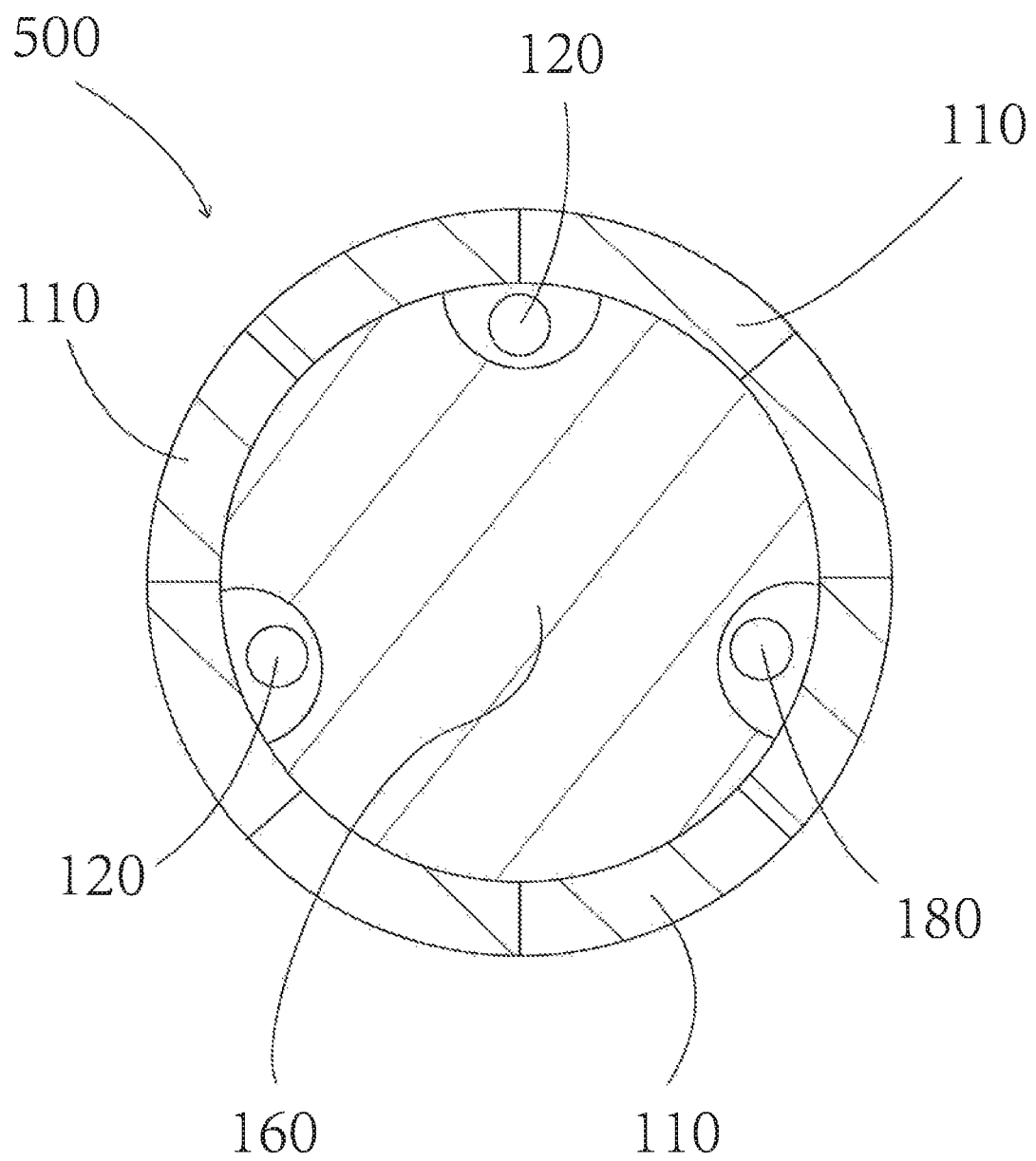
FIG. 5 is a cross-section view of a superconducting cable, according to further embodiments of the present disclosure.

In FIG. 5, an example of a cable 500 (corresponding to cable 400 discussed above) for a device 100 is shown in cross-section view, and includes a core (or former) 160 having one or more (or a plurality of) grooves that may be wound with one or more second superconducting wire(s) 120 and one or more first superconducting wire(s) 110, in a manner similar to the correspondingly labeled core (or former) and first and second superconducting wires discussed above with regard to the cable 400 in FIG. 4. However, in the example in FIG. 5, a voltage lead 180 is provided in one of the grooves in the core (or former) 160. In other examples, more than one of the grooves may include a respective voltage lead 180. In other examples, more than one voltage lead 180 may be located in each of one or more of the grooves. In yet other examples, one or more voltage leads 180 may be wound around the core (or former) 160, in space between grooves. In further examples, one or more voltage leads 180 may be integrated into the cable 500, such as within or between winds or layers of the first superconducting wire(s) 110, or of the second superconducting wire(s) 120. In further examples, one or more voltage leads 180 may extend within a center (or hollow center, not shown) of the core (or former) 160. In further examples, one or more voltage leads 180 may be wound around or otherwise extended along the outside layer of the cable 500. In further examples, one or more voltage leads 180 may be included as one or more (or all) of the strands of a multi-strand core (or former), for example, by providing a multi-strand core (or former) having one or more insulated strands along its length that function as one or more voltage leads 180.

Each voltage lead 180 may comprise any suitable electrically conductive wire, cable, tape or other electrically conductive structure, that provides normal (non-superconducting), or superconducting conduction of electrical current in the operating environment of the device 100. The voltage lead(s) 180 may be made of any suitable, normal conducting material, such as, but not limited to copper, silver, gold, or other metals, conductive ceramics, conductive polymers or the like, or superconducting materials. In particular examples, the voltage lead(s) 180 are connected to suitable electronics (such as, but not limited to circuits discussed herein) for measuring or detecting a voltage (or other signal) across the voltage lead(s). The electronics may be configured to detect a quench transition of the first or the second superconducting wires 110 or 120, thermal activity that indicates or precedes a quenching or a potential quench transition of the first or the second superconducting wires 110 or 120, or other abnormal thermal activity in the cable 500. In further examples, one or more of the grooves in the core (or former) 160 hold other mechanisms or instrumentation that can be used for quench detection or quench protection, including, but not limited to optical fibers, resistive heating wires, or voltage wires that are connected to electronics for measuring thermal activity in the cable 500 (or the device 100 that includes the cable 500) or the quench transition of the first superconducting wire(s) 110 in the cable 500.

Figure 6:
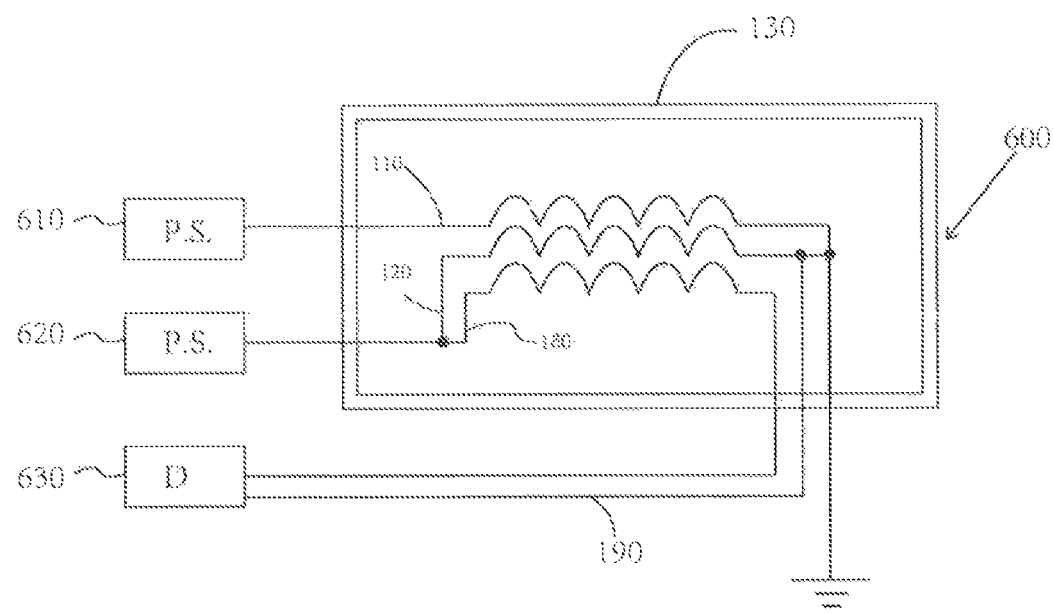
FIG. 6 is a schematic diagram of a detection circuit and superconducting cables, according to some embodiments of the present disclosure.
Figure 7:
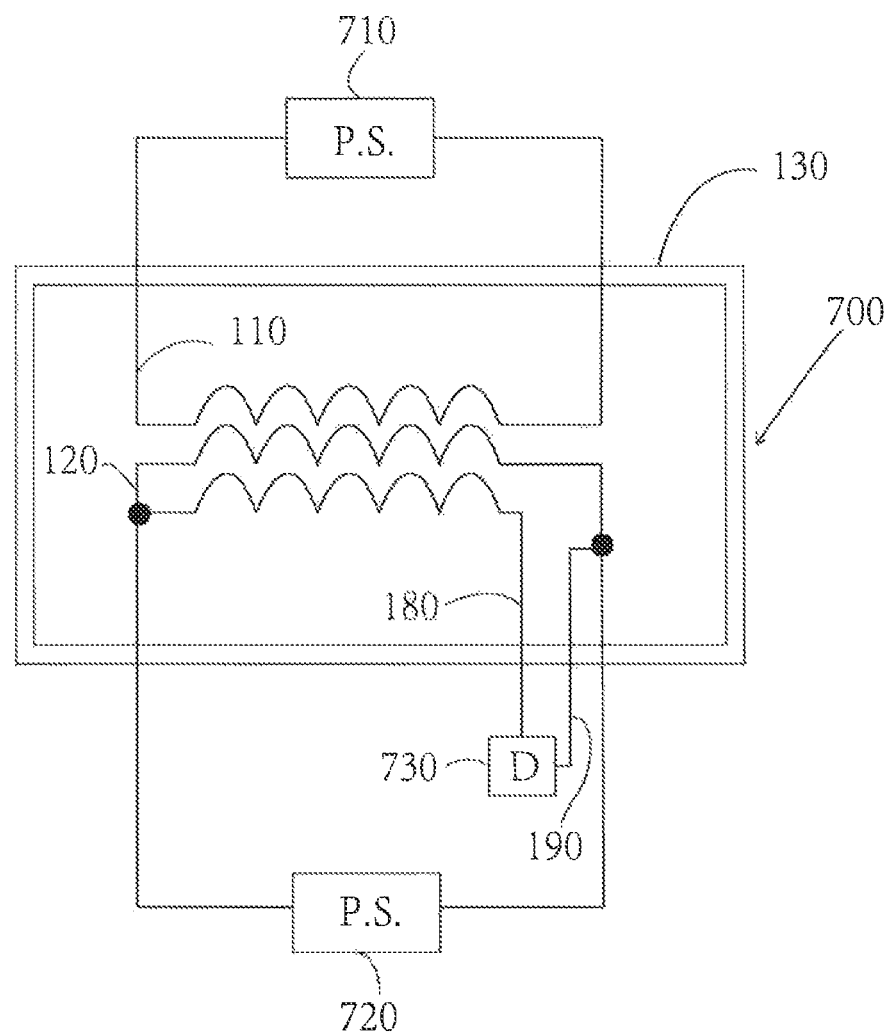
FIG. 7 is a schematic diagram of a detection circuit and superconducting cables, according to further embodiments of the present disclosure.

FIGS. 6 and 7 show schematic diagrams of examples of electronics 600 or 700 for measuring or detecting a voltage (or other signal) on the voltage lead(s) 180, to detect a quench transition of the second superconducting wire(s) 120, thermal activity that indicates or precedes a quenching or a potential quench transition of the first superconducting wires 110, or other abnormal thermal activity in a cable, such as, but not limited to the cable 500. In the diagrams of FIGS. 6 and 7, the first and second superconducting wires 110 and 120 and the voltage lead 180 correspond to similarly labeled wires and leads in other examples described herein.

As shown in the diagrams of FIGS. 6 and 7, the first and second superconducting wires 110 and 120 and the voltage lead 180 are shown with loops or winds representing, for example, winds of a coil or along a cable, as described herein. Some or all of the length of the cable (including the first and second superconducting wires 110 and 120 and the voltage lead 180) may be located within a low temperature environment, such as, but not limited to a cryostat 130 as described herein, suitable for the first and second superconducting wires 110 and 120 to be in a superconducting state. In examples in which the cable has a plurality of first superconducting wires 110, a plurality of second superconducting wires 120 and/or a plurality of voltage leads 180, the first and second superconducting wires 110 and 120 and the voltage lead 180 in FIGS. 6 and 7 may each represent a plurality of wires.

In the examples in FIGS. 6 and 7, the first superconducting wire(s) 110 are connected, at a first end, to the high potential side of the power source 110, to receive a first electrical current signal from a first power source 610 or 710. The second superconducting wire(s) 120 are connected, at a first end, to the high potential side of the power source 620 or 720 to receive a second electrical current signal from a second power source 620 or 720. In FIG. 6, a second end of each of the first and second superconducting wire(s) 110 and 120 is connected to ground, which, in some examples, may be a common ground or, in other examples, may be floating. In other examples, as in FIG. 7, the second end of one or both of the first and second superconducting wire(s) 110 and 120 is connected to a second or low potential side of the power source 710 or 720. The voltage lead(s) 180 are connected, on one end, to the high potential side of the second superconducting wire(s) 120 and, at another end, to a voltage detector 630 or 730 or other suitable detector for detecting voltage drop over the second superconducting wire(s) 120. The voltage detector 630 or 730 may be connected, through an electrical conductor 190, to the end of the second superconducting wire(s) at the side connected to the common ground (or other suitable ground). As described herein, in certain embodiments, a single power source with suitable current control circuitry may be employed to provide the first and second electrical current signals to the first and second superconducting wires 110 and 120.

In particular examples, the first power supply 610 or 710 provides the first superconducting wire(s) 110 with a substantially constant, or changing current while the first superconducting wire(s) 110 are in a superconducting state; and the second power supply 620 or 720 provides the second superconducting wire(s) 120 with a substantially constant current while the second superconducting wire(s) are operating in a superconducting state, but sufficiently near the critical surface of the second superconducting wire(s).

At least the portion of the length of the voltage wire(s) 180 is arranged in the cryostat 130 and is coupled across to at least a portion of the length of the second superconducting wire(s) 120. The voltage wire(s) 180 and the detector D 630 or 730 are connected to detect the voltage across the second superconducting wire(s) 120, to detect a quenching of (such as a sudden increase in voltage or resistance on) the second superconducting wire(s) 120. In certain examples, the detector 630 or 730 is connected to other electronics (not shown), such as control electronics or processing electronics that control one or more mechanisms or procedures for reducing or avoiding a hot spot or abnormal thermal condition in the cable 500 (or the device 100 that includes the cable 500). Accordingly, in certain examples, one or more voltage detectors (such as the detector 630 or 730) may be connected to the PS side of the second superconducting wire 120, to monitor the output voltage of the power supply 620 or 720, to detect a change in resistance of the quench wire (indicating a quench condition).

Figure 8:
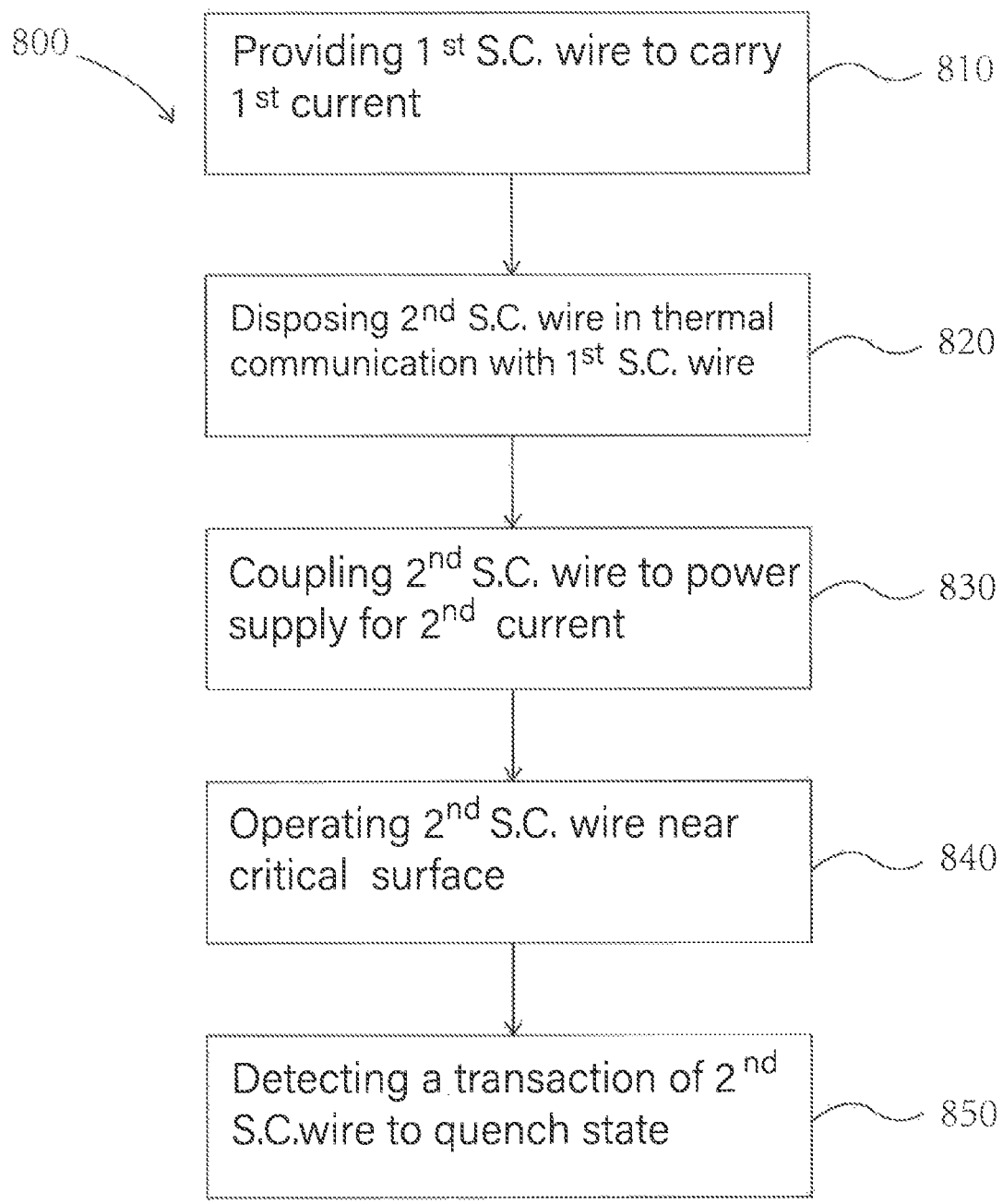
FIG. 8 is a flow chart of a method of making a superconducting device or system, according to embodiments of the present disclosure.

Superconducting devices and systems as described herein may be made according to any suitable manufacturing and assembly processes. For example, a method 800 as shown in the flow chart of FIG. 8 involves providing (at 810) a first superconducting wire configured to carry a first current in a superconducting state, and to generate a first thermal energy upon generation of a hot spot. The method 800 further includes disposing (at 820) a second superconducting wire in thermal communication with and electrically isolated from the first superconducting wire. The method 800 further includes coupling (at 830) the second superconducting wire to a power supply that is configured to supply a second current to the second superconducting wire. The method 800 further includes operating (at 840) the second superconducting wire in a state below but sufficiently near the critical surface of the second superconducting wire, to conduct the second current in a superconducting state, and to be quenched to a non-superconducting state upon conduction of the first thermal energy from the first superconducting wire to the second superconducting wire.

In particular examples, the method 800 further includes coupling a detector to the second superconducting wire, for detecting (at 850) a transition of the second superconducting wire from the superconducting state to the non-superconducting state or for detecting the non-superconducting state of the second superconducting wire. In particular examples, the method 800 further includes forming at least a portion of the first superconducting wire into a magnet. In particular examples, the method 800 further includes winding the first superconducting wire around a core, and winding the second superconducting wire along a groove in the core.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "example" and variations thereof, as used herein to describe various embodiments, are intended to indicate that such embodiments are possible examples, representations, and/or illustrations of possible embodiments (and such terms are not intended to connote that such embodiments are necessarily extraordinary or superlative examples).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

It is important to note that the construction and arrangement of the devices and systems shown in the various exemplary embodiments is illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

Additionally, any element disclosed in one embodiment may be incorporated or utilized with any other embodiment disclosed herein. Where one example of an element from one embodiment that can be incorporated or utilized in another embodiment described above, it should be appreciated that various features of different embodiments may be incorporated or utilized together with any of the other embodiments disclosed herein.

What is claimed is:

1. A superconducting device, comprising:
a first superconducting wire configured to conduct a first current in a superconducting state, and to generate thermal energy upon occurrence of a hot spot during conduction; and
a second superconducting wire having a critical surface, the second superconducting wire being thermally coupled to and electrically isolated from the first superconducting wire, the second superconducting wire being configured to conduct a second current in a superconducting state below, but sufficiently near the critical surface of the second superconducting wire to be quenched to a non-superconducting state upon conduction of sufficient thermal energy from the first superconducting wire.

2. The superconducting device of claim 1, wherein a quench propagation speed of the second superconducting wire is greater than a quench propagation speed of the first superconducting wire.

3. The superconducting device of claim 1, further comprising a detector coupled to the second superconducting wire, for detecting a transition of the second superconducting wire from the superconducting state to the non-superconducting state or for detecting the non-superconducting state of the second superconducting wire.

4. The superconducting device of claim 1, wherein at least a portion of the first superconducting wire is formed into a coil or a magnet coil.

5. The superconducting device of claim 1, wherein the first superconducting wire is formed of a material comprising at least one of REBCO, Bi-2223 or Bi-2212.

6. The superconducting device of claim 1, wherein the second superconducting wire is formed of a material comprising at least one of NbTi, $Nb_3Sn$, $MgB_2$, or an iron-based superconductor.

7. The superconducting device of claim 1, wherein the second superconducting wire is formed of a material similar to that of the first superconducting wire and is operated closer to its critical surface than the first superconducting wire.

8. The superconducting device of claim 1, wherein the second superconducting wire is configured to have a greater quench propagation speed than the quench propagation speed of the first superconducting wire by at least one of: providing a superconducting material or configuration of the second superconducting wire that provides a greater quench propagation speed than the first superconducting wire; selecting or reducing an amount of normal conducting material in the second superconducting wire; or configuring the second superconducting wire to have a selected or reduced amount of normal conducting material acting as a stabilizer or bypass current path when the second superconducting wire quenches.

9. The superconducting device of claim 1, wherein the second superconducting wire is configured to have a greater quench propagation speed than the quench propagation speed of the first superconducting wire by operating the second superconducting wire within a superconducting state, with an operating current that is adjustable to operate the second superconducting wire sufficiently near its critical surface and provide a defined level of sensitivity to quench upon the formation of a hot spot in the first superconducting wire, for a defined operating temperature and magnetic field of the superconducting device.

10. The superconducting device of claim 1, wherein the second superconducting wire is arranged in sufficient thermal communication with the first superconducting wire, such that a hot spot within the first superconducting wire just before or at the onset of a quench causes local heating of the second superconducting wire, sufficient to drive a length of the at least one second superconducting wire into a normal conduction state.

11. The superconducting device of claim 1, wherein the second superconducting wire is made of superconductors having a lower critical temperature than superconductors of the first superconducting wire.

12. A superconducting device, comprising:
a first superconducting wire configured to conduct a first current in a superconducting state, and to generate thermal energy upon occurrence of a hot spot during conduction;
a second superconducting wire having a critical surface, the second superconducting wire being thermally coupled to and electrically isolated from the first superconducting wire, the second superconducting wire being configured to conduct a second current in a superconducting state below, but sufficiently near the critical surface of the second superconducting wire to be quenched to a non-superconducting state upon conduction of sufficient thermal energy from the first superconducting wire; and
a core around which the first superconducting wire is wound, the core having at least one groove, wherein the second superconducting wire is disposed within and along the at least one groove in the core.

13. A superconducting device, comprising:
a first superconducting wire configured to conduct a first current in a superconducting state, and to generate thermal energy upon occurrence of a hot spot during conduction;
a second superconducting wire having a critical surface, the second superconducting wire being thermally coupled to and electrically isolated from the first superconducting wire, the second superconducting wire being configured to conduct a second current in a superconducting state below, but sufficiently near the critical surface of the second superconducting wire to be quenched to a non-superconducting state upon conduction of sufficient thermal energy from the first superconducting wire; and
a core around which the first superconducting wire is wound, the core having a plurality of strands of wire, wherein at least one of the strands of wire of the core includes a voltage wire that provides a detectable voltage signal upon a quenching of the second superconducting wire.

14. A method of making a superconducting device, comprising:
   providing a first superconducting wire configured to carry a first current in a superconducting state, and to generate a first thermal energy upon or prior to generation of a hot spot;
   disposing a second superconducting wire in thermal communication with and electrically isolated from the first superconducting wire, the second superconducting wire having a critical surface;
   coupling the second superconducting wire to a power supply that is configured to supply a second current to the second superconducting wire; and
   operating the second superconducting wire in a state below but sufficiently near the critical surface of the second superconducting wire, to conduct the second current in a superconducting state, and to be quenched to a non-superconducting state upon conduction of the sufficient first thermal energy from the first superconducting wire to the second superconducting wire.

15. The method of claim 14, wherein the quench propagation speed of the second superconducting wire is greater than the quench propagation speed of the first superconducting wire.

16. The method of claim 14, further comprising coupling a detector to the second superconducting wire, for detecting a transition of the second superconducting wire from the superconducting state to the non-superconducting state or for detecting the non-superconducting state of the second superconducting wire.

17. The method of claim 14, further comprising forming at least a portion of the first superconducting wire into a magnet.

18. The method of claim 14, wherein the first superconducting wire is formed of a material comprising at least one of REBCO, Bi-2223 or Bi-2212.

19. The method of claim 14, wherein the second superconducting wire is formed of a material comprising at least one of NbTi, $Nb_3Sn$, $MgB_2$, or an iron-based superconductor.

20. The method of claim 14, wherein the second superconducting wire is formed of a material similar to that of the first superconducting wire and the method further comprises operating the second superconducting wire closer to its critical surface than the first superconducting wire.

21. The method of claim 14, wherein the second superconducting wire is configured to have a greater quench propagation speed than the quench propagation speed of the first superconducting wire by at least one of: providing a superconducting material or configuration of the second superconducting wire that provides a greater quench propagation speed than the first superconducting wire; selecting or reducing an amount of normal conducting material in the second superconducting wire; or configuring the second superconducting wire to have a selected or reduced amount of normal conducting material acting as a stabilizer or bypass current path when the second superconducting wire quenches.

22. The method of making a superconducting device, comprising:
   providing a first superconducting wire configured to carry a first current in a superconducting state, and to generate a first thermal energy upon or prior to generation of a hot spot;
   disposing a second superconducting wire in thermal communication with and electrically isolated from the first superconducting wire, the second superconducting wire having a critical surface;
   coupling the second superconducting wire to a power supply that is configured to supply a second current to the second superconducting wire;
   operating the second superconducting wire in a state below but sufficiently near the critical surface of the second superconducting wire, to conduct the second current in a superconducting state, and to be quenched to a non-superconducting state upon conduction of the sufficient first thermal energy from the first superconducting wire to the second superconducting wire;
   winding the first superconducting wire around a core; and
   winding the second superconducting wire along a groove in the core.

* * * * *